(12) United States Patent
Kim

(10) Patent No.: US 9,111,646 B2
(45) Date of Patent: Aug. 18, 2015

(54) CHIP TESTER AND TEST METHOD OF SEMICONDUCTOR DEVICE

(71) Applicant: SK hynix Inc., Gyeonggi-do (KR)

(72) Inventor: Kyoung Beom Kim, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 24 days.

(21) Appl. No.: 14/077,985

(22) Filed: Nov. 12, 2013

(65) Prior Publication Data
US 2014/0369144 A1    Dec. 18, 2014

(30) Foreign Application Priority Data

Jun. 18, 2013 (KR) .................. 10-2013-0069886

(51) Int. Cl.
*G11C 17/18* (2006.01)
*G11C 29/56* (2006.01)

(52) U.S. Cl.
CPC ................................ *G11C 29/56008* (2013.01)

(58) Field of Classification Search
CPC .... G11C 29/44; G11C 29/4401; G11C 29/72; G11C 29/802; G11C 17/165; G11C 2029/0401; G11C 2229/726; G11C 29/006; G11C 29/70; G11C 2029/4402; G11C 29/56; G11C 29/785; G11C 5/04; G11C 29/04

USPC ................ 365/201, 200, 189.08, 241, 225.7, 365/185.09, 189.07, 189.15, 230.06
See application file for complete search history.

(56) References Cited

U.S. PATENT DOCUMENTS 7,215,140 B1    5/2007 Saini et al.
2008/0065929 A1*   3/2008 Nadeau-Dostie et al. ........ 714/5

OTHER PUBLICATIONS

Kim et al., Block Repair Algorithm Development in the PKG Test Process, The 14th Korea Test Conference, Jun. 19, 2013.

* cited by examiner

*Primary Examiner* — Thong Q Le
(74) *Attorney, Agent, or Firm* — IP&T Group LLP

(57) ABSTRACT

A chip tester includes a test unit suitable for performing a test on guarantee blocks and for detecting at least one second defective block from the guarantee blocks, a storage unit suitable for storing repair information, a determination unit suitable for comparing the number of available redundancy blocks, which are not allocated for first defective blocks, with the number of at least one second defective block, by referring to the repair information, and a guarantee block management unit suitable for updating the repair information to cancel allocation of at least one of a plurality of redundancy blocks based on a result of the comparison of the determination unit.

12 Claims, 8 Drawing Sheets

CHIP TESTER AND TEST METHOD OF SEMICONDUCTOR DEVICE

CROSS-REFERENCE TO RELATED APPLICATION

The present application claims priority to Korean patent application number 10-2013-0069886, filed on Jun. 18, 2013, in the Korean Intellectual Property Office, which is incorporated herein by Terence in its entirety.

BACKGROUND

1. Technical Field

Various embodiments of the present invention relate to an electronic device, and more specifically, to a chip tester and a test method of a semiconductor memory device.

2. Related Art

With the explosive increase in use of mobile information devices, such as smartphones and tablet personal computers, using semiconductor memory devices (especially, non-volatile memory devices) as storage media, there is growing interest in the semiconductor memory devices.

In addition, the advancement of various applications has led to an ever-increasing need for highly performing, highly reliable semiconductor memory devices.

A semiconductor memory device is a memory device embodied using a semiconductor, such as silicon (Si), germanium (Ge), gallium arsenide (GaAs), and indium phosphide (InP). Semiconductor memory devices may be broadly classified into volatile memory devices and non-volatile memory devices. A volatile memory device may lose stored data when power is not supplied. Volatile memory devices may include a static random access memory (SRAM), a dynamic RAM (DRAM), and a synchronous DRAM (SDRAM). A non-volatile memory device may retain stored data even when power is not supplied. Non-volatile memory devices may include a read-only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), and a ferroelectric RAM (FRAM). Flash memory devices may be divided into a NOR type flash memory and a NAND type flash memory.

In general, a non-volatile memory device includes a plurality of memory blocks. Defective blocks may be generated in some of the memory blocks due to fabrication process errors. When the defective blocks takes up a predetermined percentage or less, the corresponding non-volatile memory device may be designated as a normal memory device.

Meanwhile, there may be memory blocks that are not allowed to include defective blocks due to customers' request.

In the following description, such memory blocks are referred to as guarantee blocks. When defective blocks occur in the guarantee blocks, the corresponding non-volatile memory device may be designated as an abnormal memory device. As a result, the fabrication yield of non-volatile memory device may decrease.

SUMMARY

Various embodiments of the present invention are directed to a chip tester that may manage a semiconductor memory device and a test method of a semiconductor memory device.

One aspect of the present invention provides a chip tester for testing a semiconductor memory device, the semiconductor memory device including guarantee blocks, normal blocks, redundancy blocks, and a meta block in which repair information required to allocate the redundancy blocks for at least one first defective block generated in the normal blocks. The chip tester includes a test unit suitable for performing a test on the guarantee blocks and for detecting at least one second defective block from the guarantee blocks, a storage unit suitable for storing the repair information a determination unit suitable for comparing the number of available redundancy blocks, which are not allocated for the first defective block, with the number of the second defective block, by referring to the repair information, and a guarantee block management unit suitable for updating the repair information to cancel allocation of at least one of the redundancy blocks based on the comparison result.

Another aspect of the present invention provides a test system including, a semiconductor memory device comprising a main region including guarantee blocks and normal blocks, a plurality of redundancy blocks, and a meta block suitable for storing repair information required to allocate the redundancy blocks for first defective blocks generated in the normal blocks, and a chip tester suitable for performing a test on the guarantee blocks and for detecting at least one second defective block from the guarantee blocks. The chip tester receives the repair information, compares the number of available redundancy blocks, which are not allocated for the first defective blocks, with the number of the second defective block and updates the repair information to cancel allocation of the redundancy blocks based on a comparison result.

Still another aspect of the present invention provides a method of testing a semiconductor memory device including guarantee blocks, normal blocks, and redundancy blocks. The method includes detecting at least one first defective block from the normal blocks and allocating the redundancy blocks for the first defective block, detecting at least one second defective block from the guarantee blocks, determining whether the number of the second defective block is greater than the number of available redundancy blocks, which are not allocated for the first defective block, and re-allocating the available redundancy blocks for the second defective block based on the determination result.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION

Figure 1:
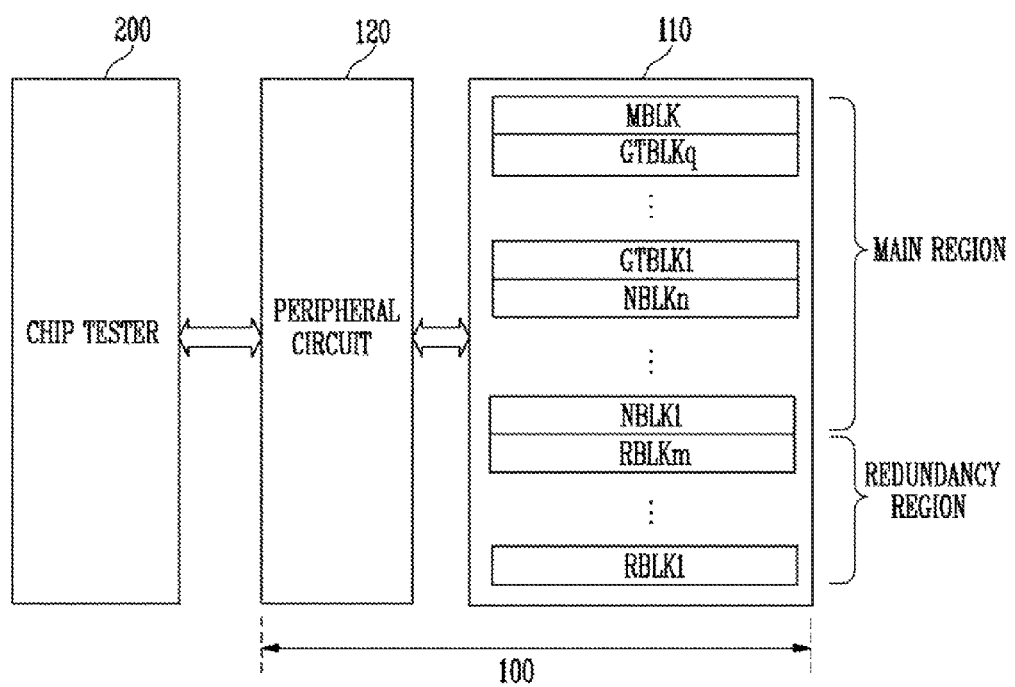
FIG. 1 is a block diagram illustrating a system environment for testing a chip.

The present invention will be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to one skilled in the art. Throughout the disclosure, reference numerals correspond directly to the like numbered parts in the various figures and embodiments of the present invention.

In the specification, it will be understood that when an element is referred to as being "connected" or "coupled" to another element, it can be directly connected or coupled to the other element or intervening elements may be present. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

FIG. 1 is a block diagram illustrating a system environment for testing a chip.

Referring to FIG. 1, in the system environment, a semiconductor memory device (or a semiconductor memory chip) 100 and a chip tester 200 may be included. The semiconductor memory device 100 may include a memory cell array 110 and a peripheral circuit 120 and be mounted on the chip tester 200.

The memory cell array 110 may include a plurality of memory blocks RBLK1 to RBLKm, NBLK1 to NBLKn, GTBLK1 to GTBLKq, and MBLK.

The memory blocks RBLK1 to RBLKm, NBLK1 to NBLKn, GTBLK1 to GTBLKq, and MBLK may form a main region and a redundancy region. The main region may include normal blocks NBLK1 to NBLKn, guarantee blocks GTBLK1 to GTBLKq, and at least one meta block MBLK. The redundancy region may include a plurality of redundancy blocks RBLK1 to RBLKm.

The redundancy blocks RBLK1 to RBLKm may repair the main region. According to an embodiment of the present invention, the redundancy blocks RBLK1 to RBLKm may replace not only the normal blocks NBLK1 to NBLKn, but also the guarantee blocks GTBLK1 to GTBLKq.

The guarantee blocks GTBLK1 to GTBLKq and the normal blocks NBLK1 to NBLKn may be, for example, a region to which an external device (not shown) may be connected to the peripheral circuit 120 and may gain access after the chip tester 200 finishes a test operation. The peripheral circuit 120 may store data in the guarantee blocks GTBLK1 to GTBLKq and the normal blocks NBLK1 to NBLKn, read data stored in the guarantee blocks GTBLK1 to GTBLKq and the normal blocks NBLK1 to NBLKn, and erase data stored in the guarantee blocks GTBLK1 to GTBLKq and the normal blocks NBLK1 to NBLKn, in response to the request of the external device.

Even when defective blocks are generated in the normal blocks NBLK1 to NBLKn, when the defective normal blocks take up a predetermined percentage or less, the semiconductor memory device 100 may be designated as a normal device. As known, a defective normal block may be designated as a bad block and replaced by any one of the redundancy memory blocks RBLK1 to RBLKm. Alternatively, the defective normal block may be designated as an invalid block.

On the other hand, when at least one defective block is generated in the guarantee blocks GTBLK1 to GTBLKq, as long as the corresponding defective block is not replaced by the redundancy blocks RBLK1 to RBLKm, the semiconductor memory device 100 may be designated as an abnormal device.

The meta block MBLK may store repair information of the semiconductor memory device 100. The repair information may include information for designating defective blocks generated in the normal blocks NBLK1 to NBLKn as bad blocks and for allocating the redundancy blocks RBLK1 to RBLKm for the bad blocks.

The repair information may be generated during a test period after the fabrication process of the semiconductor memory device 100, and may be stored in the meta block MBLK. For instance, after the semiconductor memory device 100 is fabricated in a wafer level and prior to a package process, the semiconductor memory device 100 may be tested to determine whether defective blocks are present among the normal blocks NBLK1 to NBLKn, and the repair information may be stored in the meta block MBLK based on the test result.

The peripheral circuit 120 may provide an interface between the memory cell array 110 and the chip tester 200. The chip tester 200 may access the memory cell array 110 through the peripheral circuit 120.

The chip tester 200 may perform a test on the guarantee blocks GTBLK1 to GTBLKq and detect the defective block included in the guarantee blocks GTBLK1 to GTBLKq.

According to an embodiment of the present invention, the chip tester 200 may receive repair information from the meta block MBLK and check the number of available redundancy blocks among the redundancy blocks RBLK1 to RBLKm. Here, the available redundancy blocks may refer to redundancy blocks, which are not allocated for defective blocks, among the normal blocks NBLK1 to NBLKn. In addition, the chip tester 200 may compare the number of available redundancy blocks with the number of defective guarantee blocks. Based on the comparison result, the chip tester 200 may cancel allocation of some of the redundancy blocks RBLK1 to RBLKm and may allocate the redundancy blocks RBLK1 to RBLKm for the defective guarantee blocks.

In an embodiment, the chip tester 200 may be connected to the peripheral circuit 120 after a package process is performed on the semiconductor memory device 110, and the above-described operations may be performed.

Figure 2:
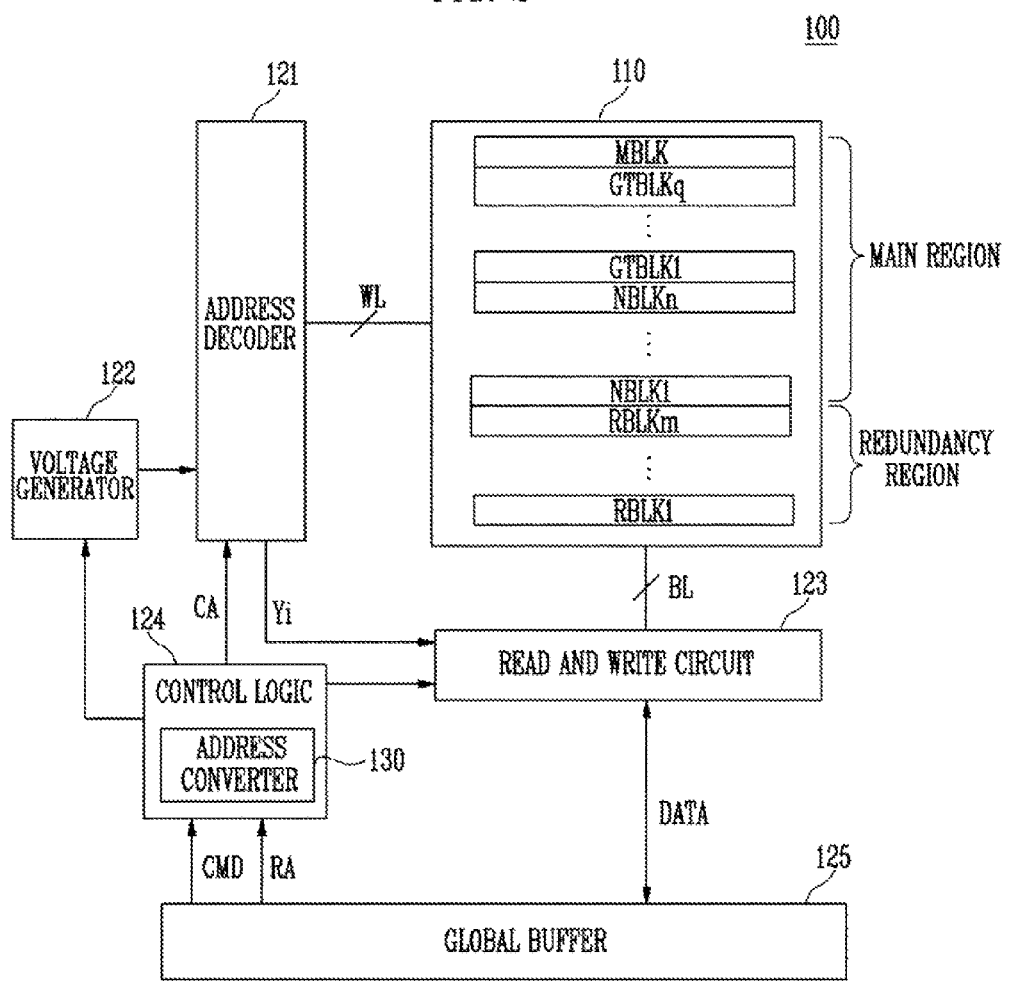
FIG. 2 is a detailed diagram illustrating a semiconductor memory device shown in FIG. 1.

FIG. 2 is a detailed diagram illustrating the semiconductor memory device 100 shown in FIG. 1.

Referring to FIG. 2, the semiconductor memory device 100 may include a memory cell array 110, an address decoder 121, a voltage generator 122, a read and write circuit 123, a control logic 124, and a global buffer 125.

The memory cell array 110 may include a plurality of memory blocks RBLK1 to RBLKm, NBLK1 to NBLKn, GTBLK1 to GTBLKq, and MBLK. The memory blocks RBLK1 to RBLKm, NBLK1 to NBLKn, GTBLK1 to GTBLKq, and MBLK may be connected to the address decoder 121 through word lines WL, and be connected to the read and write circuit 123 through bit lines BL. Each of the memory blocks RBLK1 to RBLKm, NBLK1 to NBLKn, GTBLK1 to GTBLKq, and MBLK may include a plurality of memory cells. The memory cells may be non-volatile memory cells.

The address decoder 121, the voltage generator 122, the read and write circuit 123, the control logic 124, and the global buffer 125 may be included in a peripheral circuit 120 described with reference to FIG. 1.

The address decoder 121 may be connected to the memory cell array 110 through the word lines WL. The address decoder 121 may operate in response to the control of the control logic 124. The address decoder 121 may receive a converted address CA from the control logic 124.

The address decoder 121 may decode a block address among the converted address CA. The address decoder 121 may select at least one memory block in response to the decoded block address.

The address decoder 121 may decode a row address out of a received address. The address decoder 121 may select one of the word lines WL in response to the decoded row address.

The address decoder 121 may decode a column address among the received address. The address decoder 121 may transmit the decoded column address Yi to the read and write circuit 123.

The address decoder 121 may include an address buffer, a block decoder, a row decoder, and a column decoder.

The voltage generator 122 may generate various voltages required for operations of the semiconductor memory device 100 using an external power supply voltage supplied to the semiconductor memory device 100. The voltage generator 122 may operation in response to the control of the control logic 124. The voltage generator 122 may regulate the external power supply voltage and generate an internal power supply voltage. The internal power supply voltage generated by the voltage generator 122 may be used as a driving voltage of the address decoder 121, the read and write circuit 123, the control logic 124, and the global buffer 125.

The read and write circuit 123 may be connected to the memory cell array 110 through the bit lines BL. The read and write circuit 123 may operate in response to the control of the control logic 124.

The read and write circuit 123 may exchange data DATA with the global buffer 125. During a program operation, the read and write circuit 123 may receive and store data DATA and may transmit the stored data DATA to bit lines BL indicated by the decoded column address Yi among the bit lines BL. Memory cells connected to a selected word line may be programmed according to the transmitted data DATA. During a read operation, the read and write circuit 123 may read data DATA from memory cells of a selected word line and may output the read data DATA to the global buffer 125.

In an exemplary embodiment, the read and write circuit 123 may include page buffers (or page registers).

The control logic 124 may be connected to the address decoder 121, the voltage generator 122, the read and write circuit 123, and the global buffer 125. The control logic 124 may receive a command CMD, for example, a command CMD indicating a program operation, a read operation, or an erase operation, through the global buffer 125. The control logic 124 may control overall operations of the semiconductor memory device 100 in response to the command CMD.

The control logic 124 may include an address converter 130. The address converter 130 may receive repair information received from the meta block MBLK. Bad blocks may be specified out of a main region based on repair information, and redundancy blocks RBLK1 to RBLKm allocated for the bad blocks may be specified.

The address converter 130 may receive a raw address RA through the global buffer 125. The address converter 130 may determine whether a memory block indicated by the raw address RA is a bad block, based on the repair information. When the memory block indicated by the raw address RA is the bad block, the address converter 130 may provide an address of the redundancy block allocated for the corresponding bad block. Thus, the converted address CA may be output.

That is, when the repair information stored in the meta block MBLK is changed, memory blocks of the main region for which the redundancy blocks RBLK1 to RBLKm are allocated may be changed. The updating of the repair information may be performed by the chip tester (refer to 200 in FIG. 1) as described below.

The global buffer 125 may be connected to the control logic 124 and the read and write circuit 123. The global buffer 125 may operate in response to the control of the control logic 124. The global buffer 125 may interface between the outside and the semiconductor memory device 100.

Figure 3:
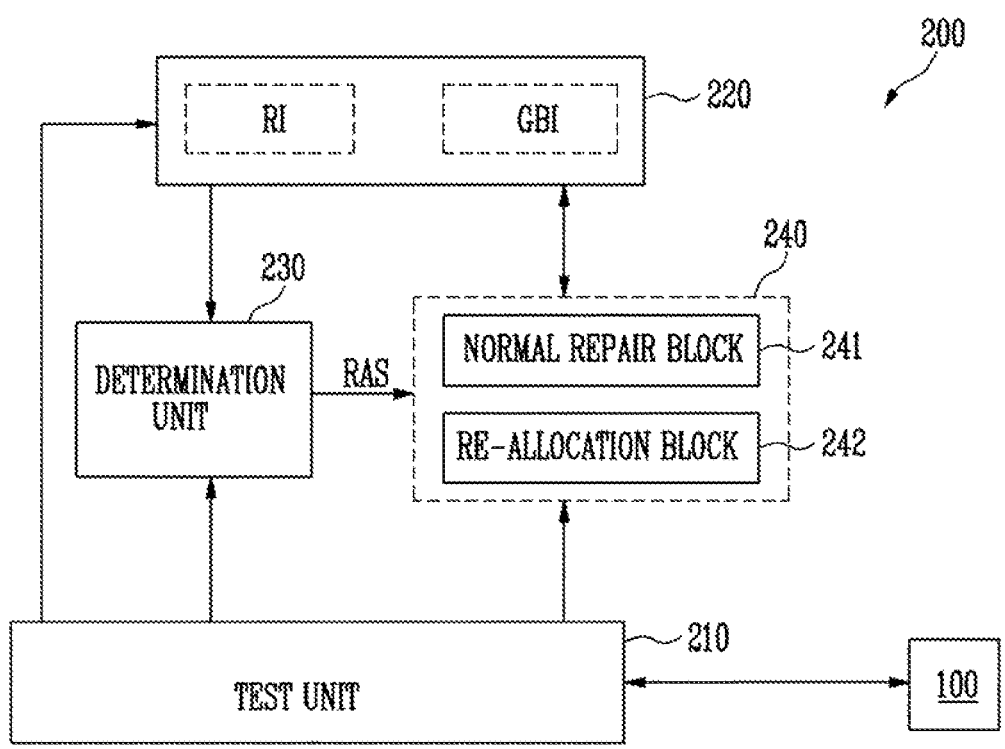
FIG. 3 is a detailed diagram illustrating a chip tester shown in FIG. 1.

FIG. 3 is a detailed diagram of the chip tester 200 shown in FIG. 1.

Referring to FIG. 3 the chip tester 200 may include a test unit 210, a storage unit 220, a determination unit 230, and a guarantee block management unit 240.

The test unit 210 may control the storage unit 220, the determination unit 230, and the guarantee block management unit 240. The test unit 210 may be connected to a semiconductor memory device 100. The test unit 210 may perform a test on guarantee blocks GTBLK1 to GTBLKq of the semiconductor memory device 100 and detect a defective block among the guarantee blocks GTBLK1 to GTBLKq. For example, the chip tester 200 may store arbitrary data in each of the guarantee blocks GTBLK1 to GTBLKq and read the stored data so that the chip tester 200 may determine whether data is normally stored and read. Also, the chip tester 200 may perform erase and read operations on each of the guarantee blocks GTBLK1 to GTBLKq and determine whether the erase operation is normally performed. In addition, it will be understood that the guarantee blocks GTBLK1 to GTBLKq may be tested using various methods.

The test unit 210 may store guarantee block information GBI in the storage unit 220 based on the test result. The guarantee block information GBI may include the number of defective blocks among the guarantee blocks GTBLK1 to GTBLKq and address information regarding the defective blocks.

The storage unit 220 may store guarantee block information GBI and repair information RI. The repair information RI may be received by the test unit 210 from a meta block MBLK of the semiconductor memory device 100 and stored in the storage unit 220. In an exemplary embodiment, the storage unit 220 may be embodied by a volatile memory, such as a static RAM (SRAM), a dynamic RAM (DRAM), or a synchronous DRAM (SDRAM).

The determination unit 230 may operate in response to the control of the test unit 210. The determination unit 230 may compare the number of defective blocks among the guarantee blocks GTBLK1 to GTBLKq with the number of available redundancy blocks of the redundancy blocks RBLK1 to RBLKm. The number of the available redundancy blocks may be determined with reference to the repair information RI. The number of defective blocks among the guarantee blocks GTBLK1 to GTBLKq may be determined with reference to the guarantee block information GBI of the storage unit 220.

The determination unit 230 may enable a re-allocation signal RAS when the number of defective blocks of the guarantee blocks GTBLK1 to GTBLKq is greater than the number of available redundancy blocks. Here, the available redundancy blocks may refer to redundancy blocks that are not allocated to any one of the redundancy blocks RBLK1 to RBLKm. When the number of the defective blocks of the guarantee blocks GTBLK1 to GTBLKq is greater than the number of the available redundancy blocks, it may be inferred that available redundancy blocks that may be allocated for defective guarantee blocks are deficient.

The determination unit 230 may disable the re-allocation signal RAS when the number of defective blocks of the guarantee blocks GTBLK1 to GTBLKq is less than the number of available redundancy blocks of the redundancy blocks RBLK1 to RBLKm.

The guarantee block management unit 240 may include a normal repair block 241 and a re-allocation block 242. When the re-allocation signal RAS is enabled, the re-allocation block 242 may be activated. When the re-allocation signal RAS is disabled, the normal repair block 241 may be activated.

The normal repair block 241 may update repair information RI so that the available redundancy blocks may be allocated for the defective guarantee blocks. That is, the repair information RI may be updated so that the defective guarantee blocks may be designated as bad blocks and the available redundancy blocks may be allocated for the defective guarantee blocks.

The re-allocation block 242 may update repair information RI, to cancel allocation of at least one of the redundancy blocks RBLK1 to RBLKm and re-allocate the corresponding redundancy blocks for defective guarantee blocks.

Thereafter, the test unit 210 may control the semiconductor memory device 100 so that the updated repair information RI may be stored in the meta block (refer to MBLK in FIG. 1).

According to the above-described method, even when defective blocks are generated in the guarantee blocks GTBLK1 to GTBLKq, the defective blocks may be designated as bad blocks and replaced by a redundancy region. Thus, the semiconductor memory device 100 may be designated as a normal memory device.

In FIG. 3, it will be understood that each of the test unit 210, the determination unit 230, and the guarantee block management unit 240 may be embodied using various methods, for example, software, hardware, firmware, or a combination of at least one thereof.

Figure 4:
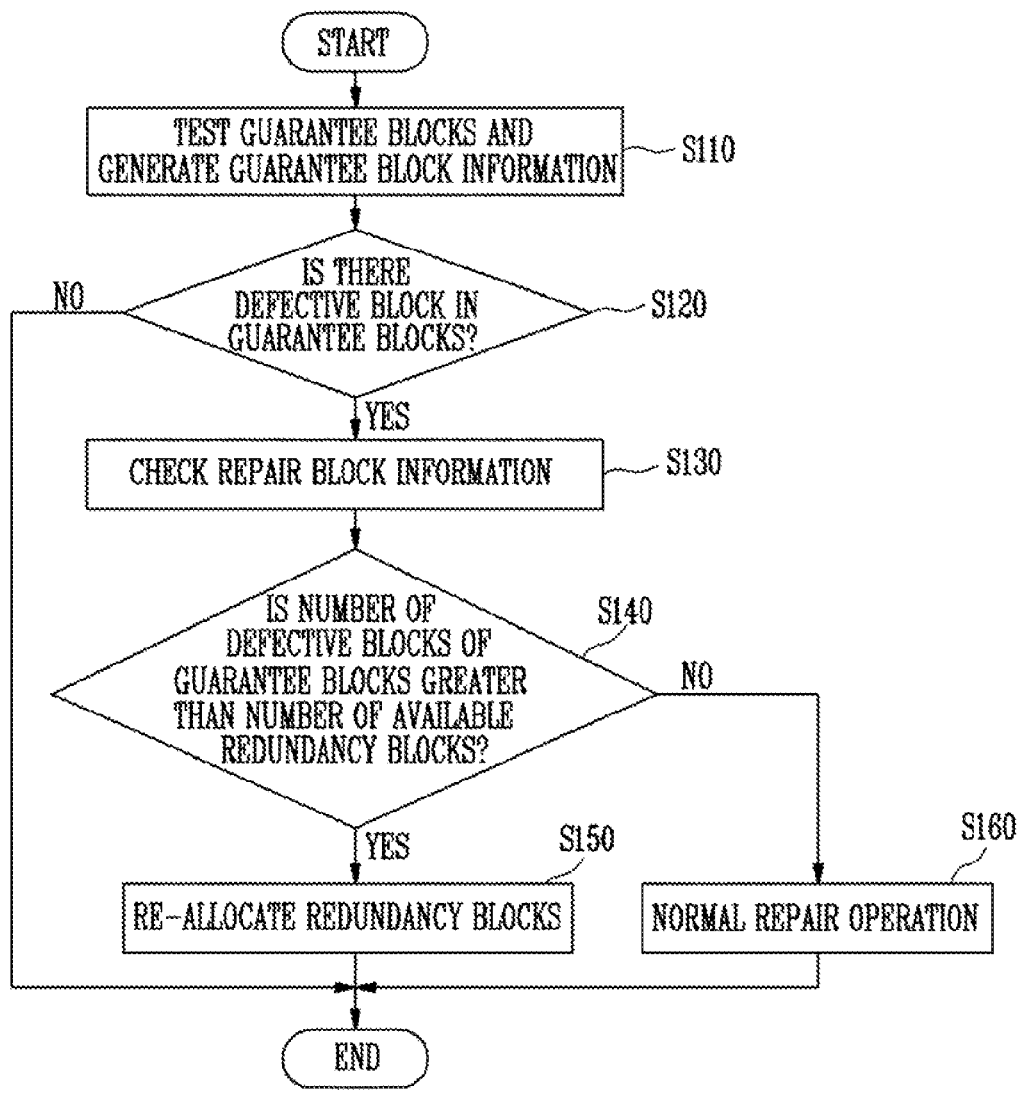
FIG. 4 is a flowchart illustrating a method of operating a chip tester according to an embodiment of the present invention.

FIG. 4 is a flowchart illustrating a method of operating the chip tester 200 according to an embodiment of the present invention.

Referring to FIGS. 3 and 4, in step S110, the test unit 210 may perform a test on guarantee blocks and generate guarantee block information GBI. The generated guarantee block information GBI may be stored in the storage unit 220.

In step S120, the determination unit 230 may refer to the guarantee block information GBI and may determine whether defective blocks are present in the guarantee blocks GTBLK1 to GTBLKq. When defective blocks are present in the guarantee blocks GTBLK1 to GTBLKq, step S130 may be performed.

In step S130, the determination unit 230 may check repair information. The test unit 210 may receive repair information RI from a meta block MBLK of the semiconductor memory device 100 and may store the repair information RI in the storage unit 220. Thereafter, the determination unit 230 may obtain the repair information RI from the storage unit 220.

In step S140 the determination unit 230 may determine whether the number of defective blocks of the guarantee blocks GTBLK1 to GTBLKq is greater than the number of available redundancy blocks of redundancy blocks RBLK1 to RBLKm. Thus, the determination unit 230 may enable or disable a re-allocation signal RAS.

In step S150, the re-allocation block 242 may re-allocate the redundancy blocks RBLK1 to RBLKm. The allocation of some of the redundancy blocks RBLK1 to RBLKm may be canceled so that the number of the available redundancy blocks becomes greater than or equal to the number of the defective guarantee blocks. Also, the available redundancy blocks may be re-allocated for the defective guarantee blocks. This will be described in further detail with reference to FIGS. 7 to 10.

In step S160, the normal repair block 241 may perform a normal repair operation. The available redundancy blocks may be allocated for the defective guarantee blocks. Since the number of the available redundancy blocks is greater than the number of the defective guarantee blocks, all the defective guarantee blocks may be mapped to specific redundancy blocks. This will be described in further detail with reference to FIGS. 5 and 6.

In steps S150 and S160, updated repair information RI may be stored in the meta block MBLK of the semiconductor memory device 100. Subsequently, the test unit 210 may additionally test the guarantee blocks GTBLK1 to GTBLKq. When the repair information RI is updated, the defective guarantee blocks may be normally replaced by some of the redundancy blocks RBLK1 to RBLKm.

Figure 5:
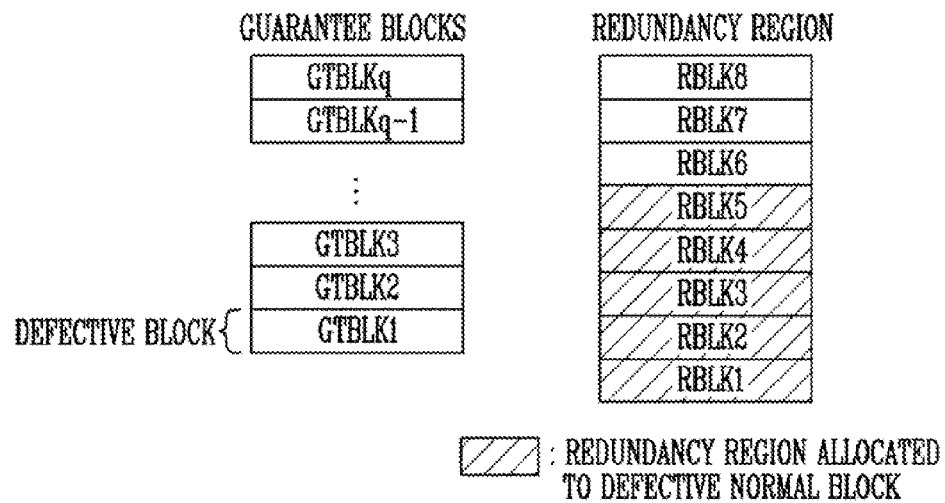
FIGS. 5 and 6 are diagrams for describing step S160 of FIG. 4.
Figure 6:
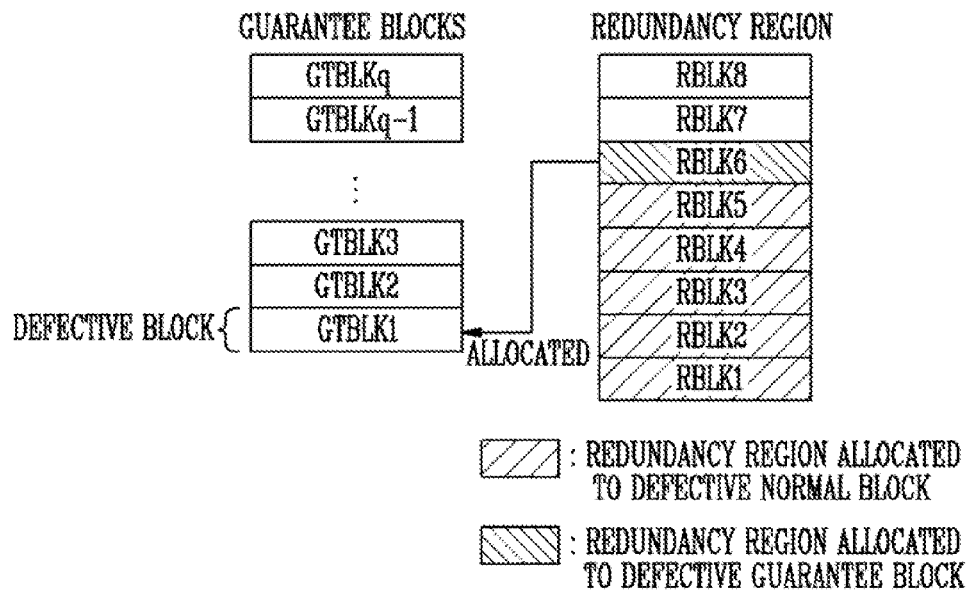

FIGS. 5 and 6 are diagrams for describing step S160 of FIG. 4.

To begin with, referring to FIG. 5, it is assumed that a first guarantee block GTBLK1 of a plurality of guarantee blocks GTBLK1 to GTBLKq is a defective block. Also, it is assumed that five redundancy blocks RBLK1 to RBLK5 of a plurality of redundancy blocks RBLK1 to RBLK8 of a redundancy region is already allocated for defective normal blocks (e.g., NBLK1 to NBLK5). Although FIG. 5 illustrates an example in which eight redundancy blocks RBLK1 to RBLK8 are provided, a greater or smaller number of redundancy blocks may be provided.

Three available redundancy blocks RBLK6 to RBLk8 and one defective block GTBLK1 may be provided. In this case, a normal repair operation may be performed. Referring to FIG. 6, any one (e.g., RBLK6) of the available redundancy blocks RBLK6 to RBLK8 may be allocated for the first guarantee block GTBLK1.

Thus, the defective guarantee block GTBLK1 may be normally replaced by the redundancy block RBLK6.

Figure 7:
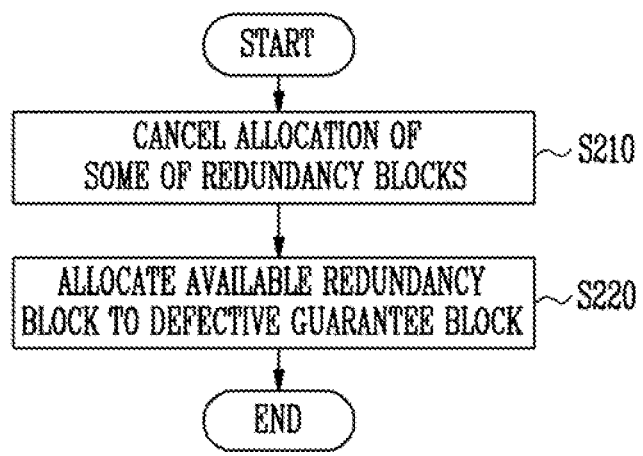
FIG. 7 is a detailed flowchart of a re-allocation step of FIG. 4.

FIG. 7 is a detailed flowchart for describing step S150 of FIG. 4.

Referring to FIG. 7, in step S210, the allocation of some of the redundancy blocks RBLK1 to RBLKm may be canceled so that the number of available redundancy blocks increases and becomes greater than or equal to the number of defective guarantee blocks. That is, the allocation of some of redundancy blocks that is already allocated for defective normal blocks may be canceled. In other words, a normal block for which the corresponding redundancy block is already allocated may be invalidated because there is no redundancy block to replace the normal block.

In step S220, the redundancy blocks RBLK1 to RBLKm may be re-allocated.

Figure 8:
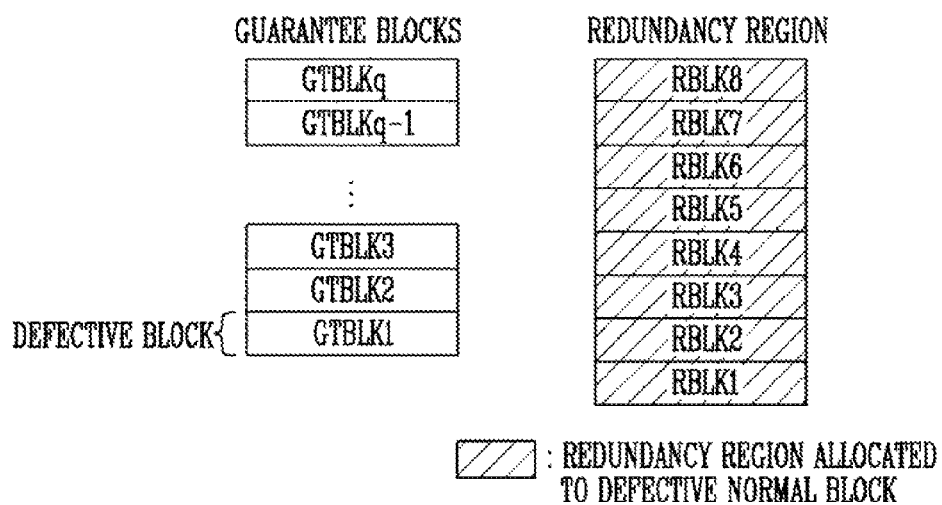
FIGS. 8 to 10 are diagrams for describing a method of re-allocating redundancy blocks.
Figure 9:
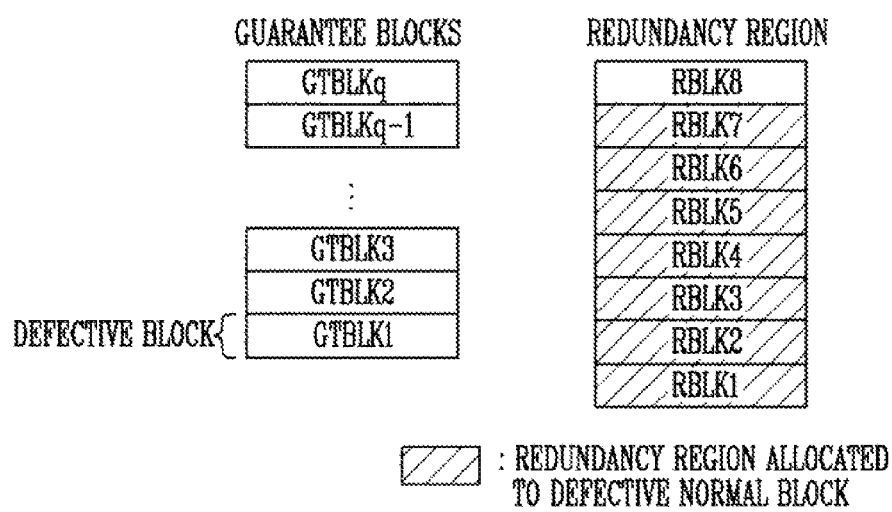
Figure 10:
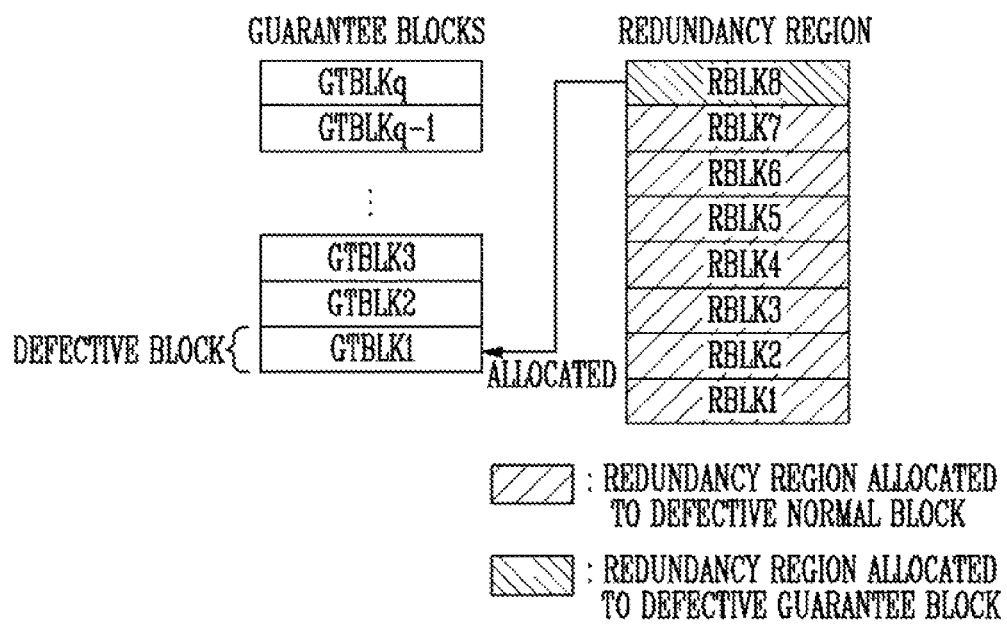

FIGS. 8 to 10 are diagrams for describing a method of re-allocating redundancy blocks RBLK1 to RBLK8.

To begin with, referring to FIG. 8, it is assumed that a first guarantee block GTBLK1 of a plurality of guarantee blocks GTBLK1 to GTBLKq is a defective block. Also, it is assumed that eight redundancy blocks RBLK1 to RBLK8 of a plurality of redundancy blocks RBLK1 to RBLK8 of a redundancy region is already allocated for defective normal blocks (e.g. NBLK1 to NBLK8). Thus, it may be inferred that redundancy blocks that may be allocated for the defective guarantee block GTBLK1 are not present.

In this case, the redundancy blocks RBLK1 to RBLK8 may be re-allocated. Referring to FIG. 9, allocation of part (RBLK8) of the redundancy blocks RBLK1 to RBLK8 allocated for the defective normal blocks may be canceled to ensure available redundancy blocks. Also, referring to FIG. 10, the redundancy block RBLK8 of which allocation is canceled may be re-allocated to the defective guarantee block GTBLK1. In this case, the defective normal block for which the eighth redundancy block RBLK is previously allocated may be invalidated because a redundancy block to replace the defective normal block is not present.

That is, the defective guarantee block GTBLK1 may be replaced by the redundancy block RBLK8.

FIGS. 8 to 10 illustrate examples in which the redundancy block RBLK8 of which allocation is canceled is allocated for the defective guarantee block GTBLK1. However, the present invention is not limited thereto. For example, the second through eighth redundancy blocks RBLK2 to RBLK8 may be re-allocated for defective normal blocks for which the first through seventh redundancy blocks RBLK1 to RBLK7 is allocated, and the first redundancy block RBLK1 may be re-allocated for the defective guarantee block GTBLK1. That is, since the allocation of some of the redundancy blocks RBLK1 to RBLK8 is canceled, a method of re-allocating the ensured available redundancy block for the defective guarantee block GTBLK1 may be variously changed.

According to an exemplary embodiment of the present invention, when a defective block is generated in guarantee blocks, the corresponding guarantee block may be replaced by a redundancy region. Accordingly, the reliability of the guarantee blocks may be ensured. As a consequence, the fabrication yield of semiconductor memory devices may be improved.

According to an exemplary embodiment of the present invention, a chip tester that may manage a semiconductor memory device and a test method thereof are provided.

In the drawings and specification, there have been disclosed typical exemplary embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A chip tester for testing a semiconductor memory device, the semiconductor memory device including guarantee blocks, normal blocks, redundancy blocks, and a meta block in which repair information required to allocate the redundancy blocks for at least one first defective block generated in the normal blocks, the chip tester comprising:
    a test unit suitable for performing a test on the guarantee blocks and for detecting at least one second defective block from the guarantee blocks;
    a storage unit suitable for storing the repair information;
    a determination unit suitable for comparing the number of available redundancy blocks, which are not allocated for the first defective blocks, with the number of the second defective block, by referring to the repair information; and
    a guarantee block management unit suitable for updating the repair information to cancel allocation of at least one of the redundancy blocks based on the comparison result.

2. The chip tester according to claim 1, wherein the determination unit cancels the allocation of the at least one of the redundancy blocks so that the number of the available redundancy blocks becomes greater than or equal to the number of the second defective block.

3. The chip tester according to claim 2, wherein the guarantee block management unit updates the repair information so that the available redundancy blocks are allocated for the second defective block.

4. The chip tester according to claim 1, wherein the guarantee block management unit updates the repair information to cancel the allocation of the at least one of the redundancy blocks when the number of the available redundancy blocks is less than the number of the second defective block.

5. The chip tester according to claim 1, wherein the guarantee block management unit updates the repair information so that the available redundancy blocks are allocated for the second defective block when the number of the available redundancy blocks is greater than or equal to the number of the second defective block.

6. The chip tester according to claim 1, wherein the test unit detects the second defective block and stores guarantee block information in the storage unit.

7. The chip tester according to claim 6, wherein the determination unit recognizes the number of the second defective blocks based on the guarantee block information and recognizes the number of the available redundancy blocks based on the repair information.

8. The chip tester according to claim 6, wherein the determination unit refers to the guarantee block information and performs the comparison operation when the second defective block is present.

9. A method of testing a semiconductor memory device, the semiconductor memory device including guarantee blocks, normal blocks, and redundancy blocks, the method comprising:
    detecting at least one first defective block from the normal blocks and allocating the redundancy blocks for the first defective block;
    detecting at least one second defective block from the guarantee blocks;
    determining whether the number of the second defective block is greater than the number of available redundancy blocks, which are not allocated for the first defective block; and
    re-allocating the available redundancy blocks for the second defective block based on the determination result.

10. The method according to claim 9, further comprising:
    canceling allocation of at least one of the redundancy blocks based on the determination result, before the re-allocating of the available redundancy blocks.

11. The method according to claim 10, wherein the semiconductor memory device further includes a meta block, and the method further comprising:
    generating repair information based on a result of the allocation of the redundancy blocks for the first defective block, and storing the repair information in the meta block.

12. The method of claim 10, wherein, after the canceling of the allocation of the redundancy blocks, the number of the available redundancy blocks becomes greater than or equal to the number of the second defective block.

* * * * *